United States Patent
Wu et al.

(10) Patent No.: US 7,271,020 B2
(45) Date of Patent: Sep. 18, 2007

(54) LIGHT EMITTING DIODE COVERED WITH A REFLECTIVE LAYER AND METHOD FOR FABRICATING THE SAME

(75) Inventors: Enboa Wu, Taipei (TW); Xing-Xiang Liu, Taipei (TW); Chia-Shou Chang, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 11/234,223

(22) Filed: Sep. 26, 2005

(65) Prior Publication Data

US 2006/0086943 A1    Apr. 27, 2006

(30) Foreign Application Priority Data

Oct. 22, 2004   (TW) ............................... 93132241 A

(51) Int. Cl.
*H01L 21/00* (2006.01)
(52) U.S. Cl. ............................ 438/26; 438/22; 438/29; 257/E33.055
(58) Field of Classification Search ..................... None
See application file for complete search history.

(56) References Cited

U.S. PATENT DOCUMENTS

2005/0104080 A1 * 5/2005 Ichihara et al. ............... 257/98
2006/0033116 A1 * 2/2006 Chae et al. ................... 257/96

\* cited by examiner

*Primary Examiner*—Evan Pert
*Assistant Examiner*—Kevin Quinto
(74) *Attorney, Agent, or Firm*—Birch, Stewart, Kolasch & Birch, LLP.

(57) ABSTRACT

A light emitting diode (LED) covered with a reflective layer by imprinting process is provided. The imprinting process includes coating a plastic layer on a mold to form an imprinting substrate; coating a reflective layer on the plastic layer and modifying the shape of the reflective layer to fit the shape of outer surfaces of the light emitting diode; softening the plastic layer and impressing the mold covered with the reflective layer upon the LED structure so that the reflective layer adheres to the surfaces of LED; and removing the mold. Because the reflective layer has high reflectivity, the light emitted from the top surface and side surfaces of LED is reflected back to the light extraction direction, and thereby the light extraction efficiency is enhanced.

12 Claims, 7 Drawing Sheets

LIGHT EMITTING DIODE COVERED WITH A REFLECTIVE LAYER AND METHOD FOR FABRICATING THE SAME

BACKGROUND OF THE INVENTION

1. Field of the Invention

The invention relates to a light emitting device, and more particularly to a light emitting diode covered with a reflective layer.

2. The Prior Arts

A light emitting diode (LED) is a semiconductor optoelectronic device that can generate light. FIG. 1 illustrates a typical light emitting diode. The light emitting diode 10' includes a substrate 11', a first semiconductor layer 12' (n-type semiconductor layer) formed on the surface of the substrate 11', and a active layer 13' and a second semiconductor layer 14' (p-type semiconductor layer) formed on the first semiconductor layer 12' subsequently. The light emitting diode emits enough photons by giving off energy in the form of light during the process of recombining the electrons with the holes near the p-n junction area in order to achieve the desired illuminating effect. Light emitting diodes have the features of small size, light weight, high illuminating efficiency, and low manufacturing cost so that they are typically used as the light sources of display devices, traffic signals and optical fiber communications nowadays. However, the technical bottleneck for the light extraction efficiency of light emitting diodes still need to be made breakthrough because the light emitted by recombining the carriers is radially scattered so that the light is not all emitted from the direction of light extraction. As a result, the brightness of light emitting diodes cannot reach the desired value, and also too much heat is generated during light scattering.

To overcome the drawback of low light extraction efficiency, a few literatures disclosed methods for improving the light extraction efficiency of LED. However, all those methods have drawbacks and limits thereof. For example, in U.S. Pat. No. 6,155,699, Miller et al. disclosed a distributed Bragg reflector (DBR) structure comprised of multiple alternating layers of high and low refractive index materials as a reflective layer of LED to enhance the light extraction efficiency of LED.

In another example, Taiwan patent no. 541,728 disclosed a highly reflective dielectric stack formed on the mesa wall of a flip-chip LED. The dielectric stack is composed of alternating low refractive index and high refractive index layers. The highly reflective stack reduces the light lost through the mesa wall by reflecting and thereby redirecting a larger portion of the guided light within the LED chip which is incident on the coated mesa wall. However, the highly reflective dielectric stack was only formed on the mesa wall of a flip-chip LED, and the light lost still occurred on the other side surfaces. Furthermore, the highly reflective dielectric stack can be formed only on the mesa wall having a certain range of tilt angles. Moreover, the stack is fabricated by a general photolithographic process, and thereby the manufacturing cost is extremely high.

In another example, Taiwan patent no. 488,089 disclosed a light emitting diode having an optical reflective film which was used for reflecting the light transmitted through the transparent substrate to enhance the illuminant effect. However, the light transmitted through the side surfaces of the light emitting diode can not be reflected by the optical reflective film so that the improvement for the light extraction efficiency of LEDs is limited. Taiwan patent no. 577,178 disclosed a high efficient light emitting diode having reflective metal layer, and a structure which can prevent the reflective metal layer from reacting with the p-type ohmic contact during an annealing process. However, the light transmitted through the side surfaces of the light emitting diode can not be reflected by the optical reflective film so that the improvement for the light extraction efficiency of LEDs is limited.

From the reflective structures of the conventional LEDs, it can be seen that only portions of light or a certain wavelength of light can be reflected by DBR or optical reflective film structures. Meanwhile, these structures are fabricated by the complicated photolithographic and etching process. To overcome the drawbacks of conventional reflective structures, a method for improving the light extraction efficiency and simplifying the fabrication of the reflective structure need to be provided in order to meet the requirements of the rapid advancements of products.

SUMMARY OF THE INVENTION

The present invention provides a method for fabricating a light emitting device, including covering a light emitting device with a reflective layer, comprising the following steps: providing a mold; coating a plastic layer on the mold; coating a reflective layer on the plastic layer; softening the plastic layer; impressing the mold upon the light emitting device so that the outer surfaces of the light emitting device are covered with the reflective layer coated on the mold; hardening the plastic layer; and removing the mold.

According to one aspect of this invention, the light emitting device is a light emitting diode die, or a laser die.

According to one aspect of this invention, the light emitting device is a plurality of light emitting diode dies, or a plurality of laser dies.

According to one aspect of this invention, the light emitting device is a wafer-level light emitting diode dies, or a laser die.

According to one aspect of this invention, the packaging structure of the light emitting device can be selected from one of the group consisting of wire-bonding packaging structure, flip-chip packaging structure and wafer-level packaging structure.

According to one aspect of this invention, the mold is a material having thermal conductivity, which is selected from one of the group consisting of gold, silver, copper, iron, tin, aluminum, titanium, beryllium, chromium, germanium, gallium, lead, nickel, zinc, silicon, blue sapphire, ceramics, and polymer.

According to one aspect of this invention, the plastic layer is a material having elastic-plastic property, which is selected from one of the group consisting of polydimethylsiloxane (PDMS), poly(methyl methacrylate)(PMMA), polyurethane elastomers, polystyrenes, olefins, dienes, polyethylenes, polyvinyl chlorides, polyesters, and organic fluorines.

According to one aspect of this invention, coating the plastic layer and coating the reflective layer are performed by one process selected from the group consisting of spin coating, deposition, injection molding, and imprinting.

According to one aspect of this invention, softening the plastic layer is performed by one process selected from the group consisting of heating, and adding plastifier.

According to one aspect of this invention, hardening the plastic layer is performed by one process selected from the group consisting of cooling, and adding hardener.

According to one aspect of this invention, the method for fabricating a light emitting device further comprises removing a portion of the reflective layer.

According to one aspect of this invention, removing the portion of the reflective layer is performed by one process selected from the group consisting of photolithography and etching, softlithography and etching, imprinting, laser processing, ion beam processing, and micro machining.

The present invention further provides a light emitting device, comprising: a substrate; a first semiconductor layer formed on the substrate and including a first electrode; a second semiconductor layer formed on the first semiconductor layer and including a second electrode; a active layer formed between the first semiconductor layer and the second semiconductor layer; and a reflective layer formed on the side surfaces and top surface of the stack structure consisting of the substrate, the first semiconductor layer, the second semiconductor layer, and the active layer.

According to one aspect of this invention, the reflective layer structure is a composite material structure, or a single material structure.

According to one aspect of this invention, the composite material at least includes a nonconductive material and a reflective material.

According to one aspect of this invention, the single material is a reflective material having nonconductivity.

According to one aspect of this invention, the reflective material at least includes an adhesive material which can adhere to the outer surfaces of the substrate, the first semiconductor layer, the active layer, and the second semiconductor layer.

According to one aspect of this invention, the light emitting device further comprises a packaging structure.

According to one aspect of this invention, the reflective layer is one part of the packaging structure.

This invention will be more fully understood in light of the following detailed description taken together with the accompanying drawings. In the drawings, the same reference numeral denotes the same element.

DETAILED DESCRIPTION OF THE PREFERRED EMBODIMENT

The present invention provides a method for fabricating a light emitting device covered with a reflective layer, and provides a light emitting device covered with a reflective layer. The present invention will be understood by reference to the following detailed description of illustrative embodiments when read in conjunction with the accompanying drawings.

Figure 1:
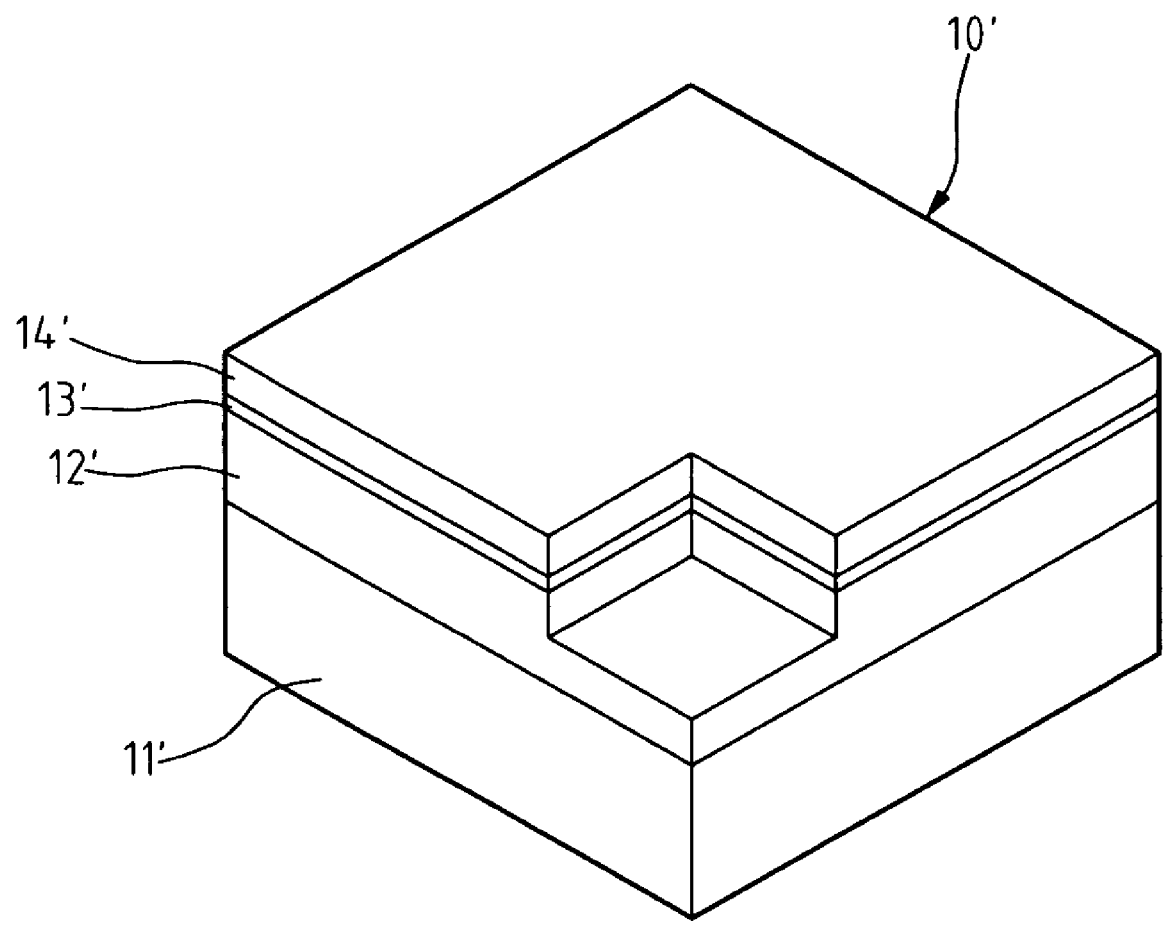
FIG. 1 shows a conventional stack structure of a light emitting diode.
Figure 2:
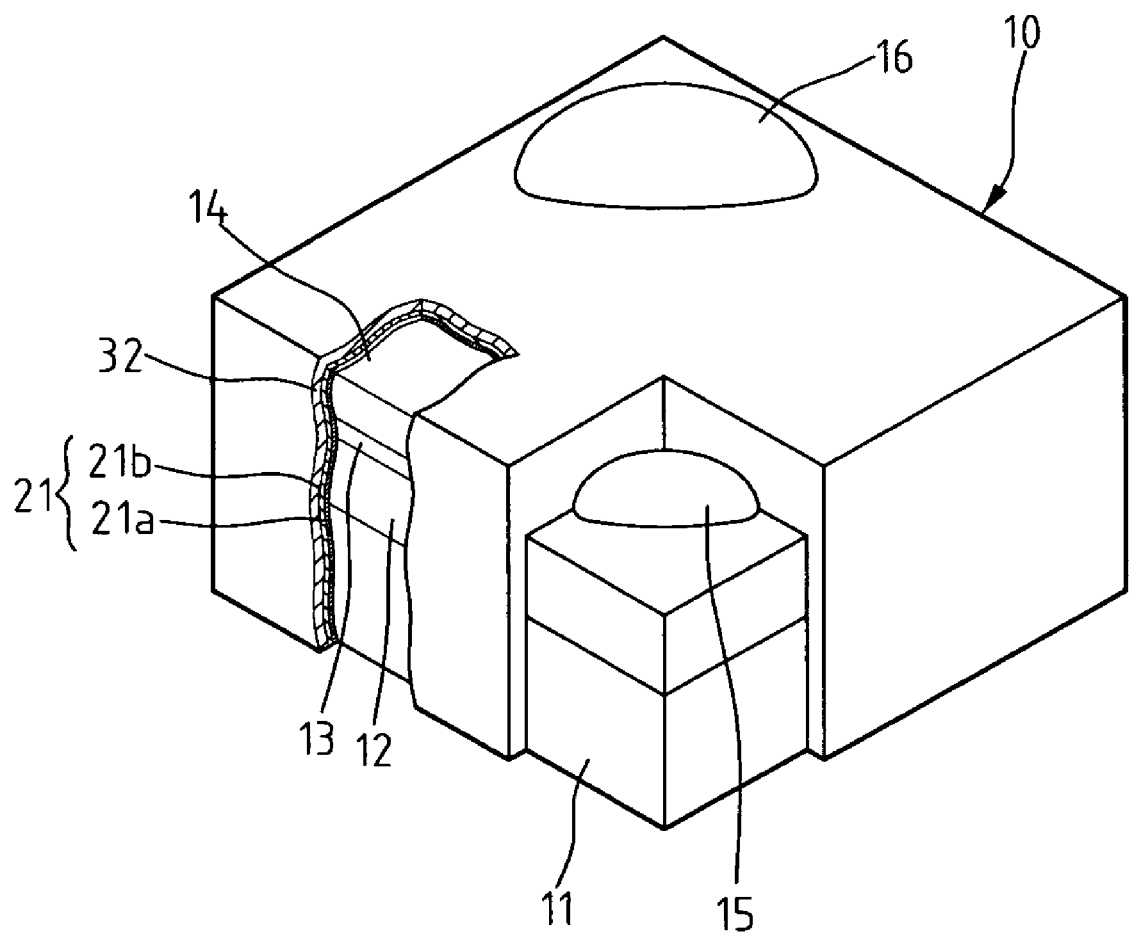
FIG. 2 shows a light emitting device covered with a reflective layer according to the present invention.

FIG. 2 illustrates a light emitting device 10 having the top surface and side surfaces covered with a reflective layer structure according to the present invention. The light emitting device 10 comprises: a substrate 11; a first semiconductor layer 12 formed on the substrate 10; a active layer 13 formed on the first semiconductor layer 12; and a second semiconductor layer 14 formed on the active layer 13; wherein the first semiconductor layer 12 and the second semiconductor layer 14 have a first electrode 15 and a second electrode 16 thereon, respectively, and the top surface and side surfaces of the stack structure consisting of the substrate 11, the first semiconductor layer 12, the active layer 13, and the second semiconductor layer 14 are covered with a reflective layer structure 21. The reflective layer structure 21 further includes an adhesive material layer 21a and a reflective material layer 21b.

The reflective layer structure 21 consisting of an adhesive material layer 21a and a reflective material layer 21b is a composite material structure, or a single material structure, wherein the reflective layer structure 21 has nonconductivity and high reflectivity.

Figure 3A:
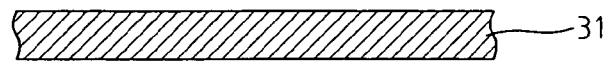
FIGS. 3a-g shows the steps of the method for fabricating the light emitting device covered with a reflective layer according to the present invention.
Figure 3B:
Figure 3C:
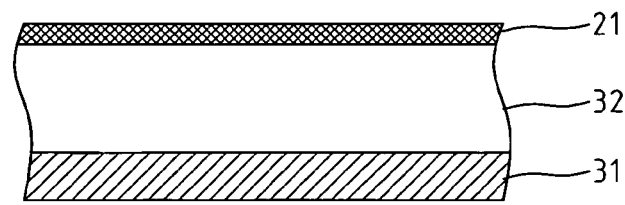
Figure 3D:
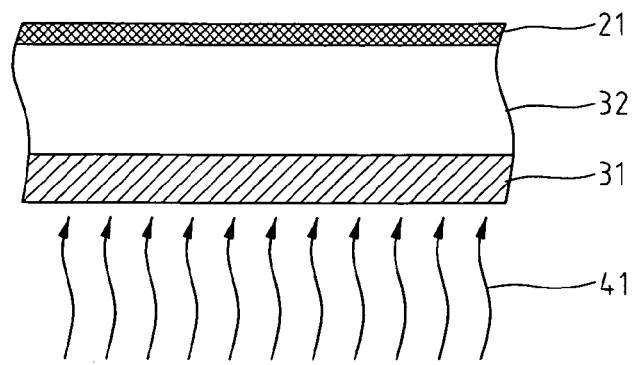
Figure 3E:
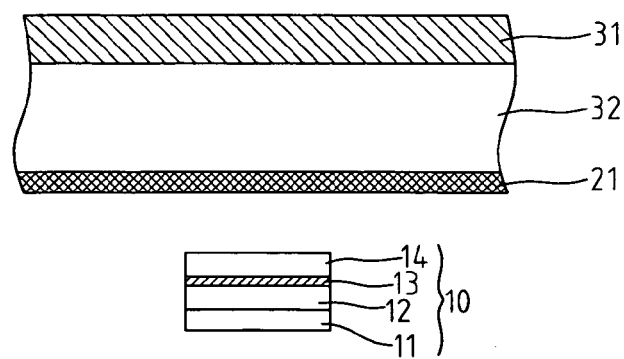
Figure 3F:
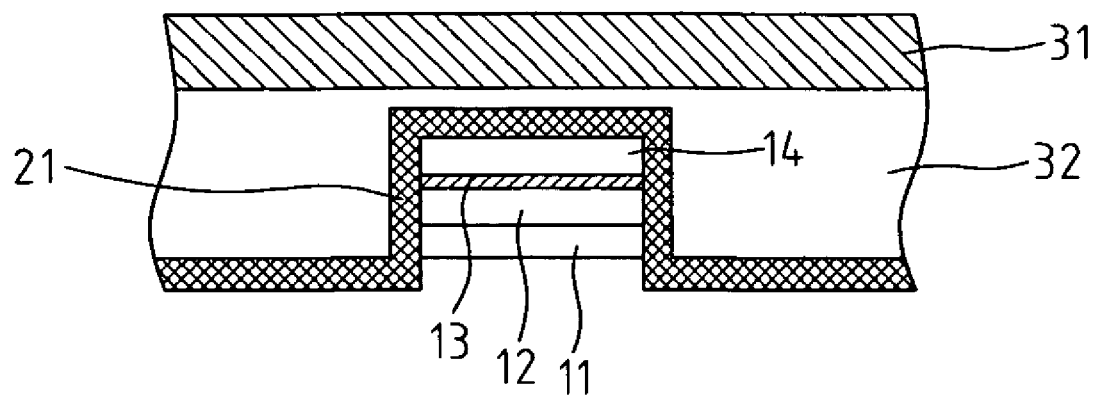
Figure 3G:
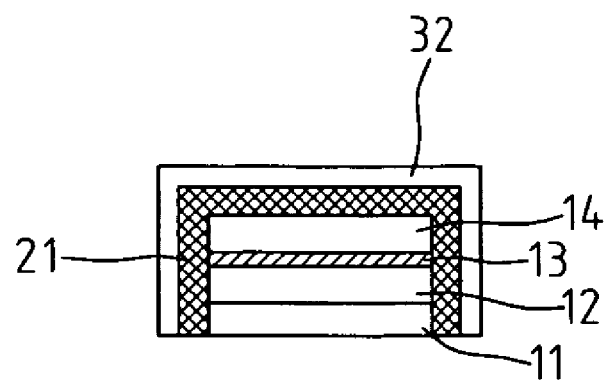

FIGS. 3a-g illustrates a method for fabricating a light emitting device, characterized in that the reflective layer structure 21 is coated on the light emitting device 10. The method comprises the following steps: providing a mold 31, as shown in FIG. 3a; coating a plastic layer 32 on a mold 31, as shown in FIG. 3b; coating a reflective layer structure 21 on the plastic layer 32, as shown in FIG. 3c; softening 41 the plastic layer 32, as shown in FIG. 3d; providing a light emitting device 10, as shown in FIG. 3e; impressing the mold 31 with the plastic layer 32 and the reflective layer structure 21 formed thereon upon the light emitting device 10 so that the reflective layer structure 21 coated on the mold 31 covers the outer surfaces of the light emitting device 10 due to the deformation of the plastic layer 32 after softening 41 it., as shown in FIG. 3f; and removing the mold 31 after hardening the plastic layer 32, as shown in FIG. 3g.

In the above-mentioned steps, the light emitting device 10, as shown in FIG. 3e, is selected from one of the group consisting of a light emitting diode die, a laser die, a plurality of light emitting diode dies, and a wafer-level light emitting diode. The packaging structure of the light emitting device 10 can be selected from one of the group consisting of wire-bonding packaging structure, flip-chip packaging structure, and wafer-level packaging structure.

The mold 31, as shown in FIGS. 3a-f, is a material having thermal conductivity, which is selected from one of the group consisting of gold, silver, copper, iron, tin, aluminum, titanium, beryllium, chromium, germanium, gallium, lead, nickel, zinc, silicon, blue sapphire, ceramics, polymer, and a combination thereof. The plastic layer 32, as shown in FIGS. 3a-g, is a material having elastic-plastic property, which is selected from one of the group consisting of polydimethylsiloxane (PDMS), poly(methyl methacrylate), polyurethane elastomers, polystyrenes, olefins, dienes, polyethylenes, polyvinyl chlorides, polyesters, organic fluorines, and a combination thereof.

Coating the plastic layer 32 and coating the reflective layer 21, as shown in FIGS. 3b-c, are performed by one process selected from the group consisting of spin coating, deposition, injection molding, imprinting, and a combination thereof. Softening 41 the plastic layer 32, as shown in FIG. 3d, is performed by one process selected from the group consisting of heating, adding plastifier, and a combination thereof. Hardening the plastic layer 32 is performed by one process selected from the group consisting of cooling, adding hardener, and a combination thereof.

Figure 3H:
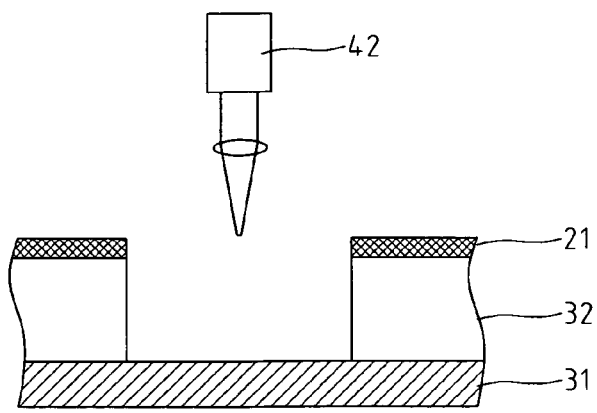
FIGS. 3h-i shows the step of removing the portion of the reflective layer structure before the step of impressing the reflective layer structure upon the light emitting device.
Figure 3I:
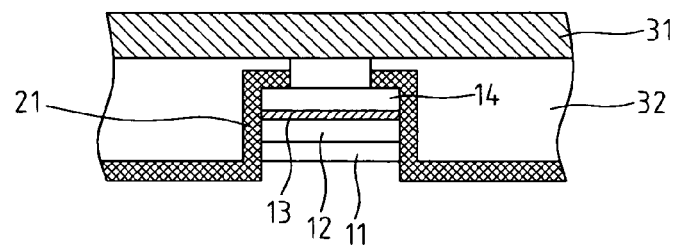
Figure 3J:
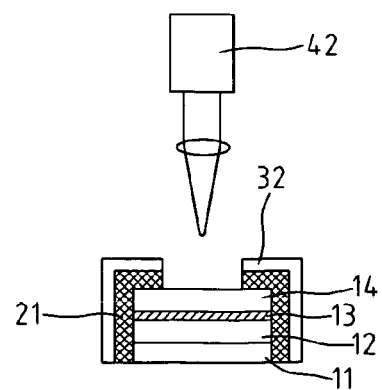
FIG. 3j shows the step of removing the portion of the reflective layer structure after the step of impressing the reflective layer structure upon the light emitting device.

Referring to FIGS. 3h-j, the present invention provides a method for fabricating a light emitting device, which further comprises removing a portion of the reflective layer structure 21 to fit the outer structure of the light emitting device 10. The step of removing the portion of the reflective layer structure 21 can be performed before the step of impressing the reflective layer structure 21 upon the light emitting device 10, as shown in FIGS. 3h-i, or can be performed after the step of impressing the reflective layer structure 21 upon the light emitting device 10, as shown in FIG. 3j. Removing the portion of the reflective layer structure 21 is performed by one process selected from the group consisting of photolithography and etching, softlithography and etching, imprinting, laser processing, ion beam processing, micro machining, and a combination thereof.

Figure 4:
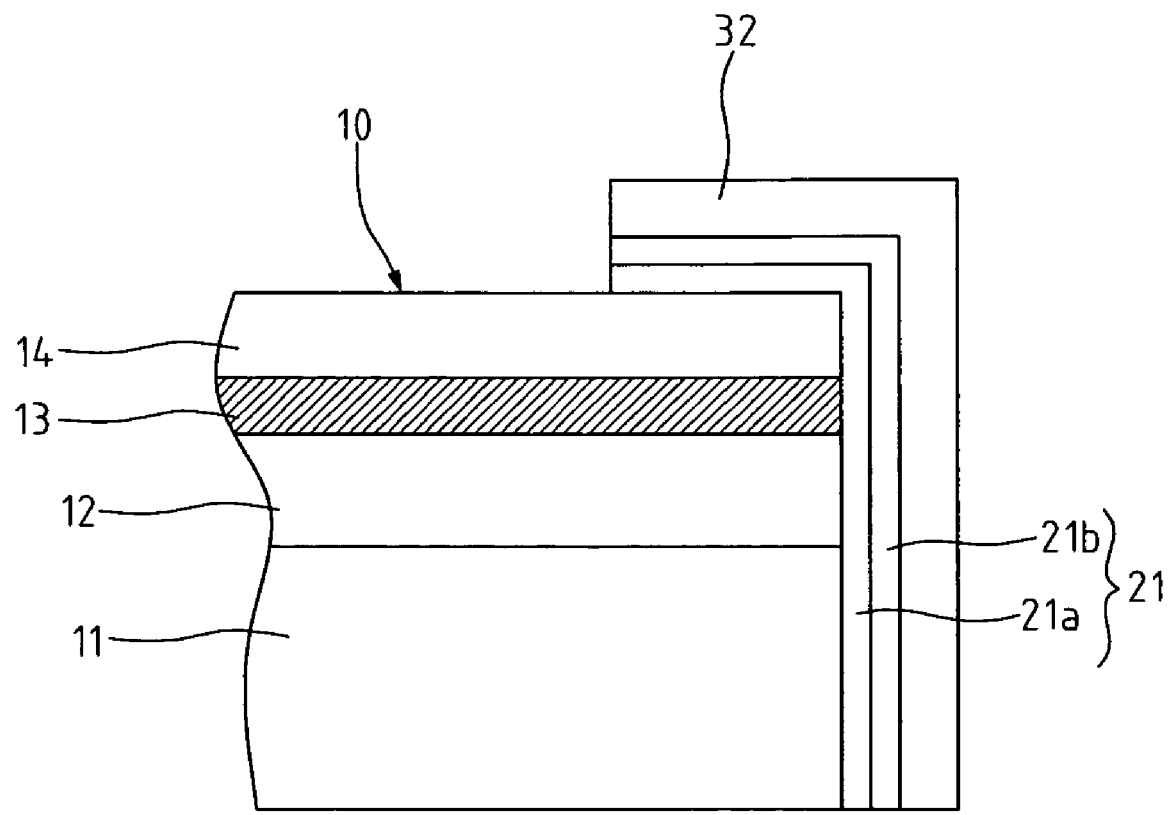
FIG. 4 shows a schematic view of the stack structure of the light emitting diode covered with a reflective layer according to the present invention.

Referring to FIG. 4, the present invention provides the above-mentioned steps in order to cover the light emitting device 10 with the reflective layer structure 21. The method is characterized in that the reflective layer structure 21 can fit the outer shape of the light emitting device 10 when covering the light emitting device 10, and the reflective layer structure 21 can be adhered to any site on the outer surfaces of the light emitting device 10.

The foregoing description of the embodiments of the invention has been presented for purposes of illustration and description. It is not intended to limit the invention to the precise form disclosed. It will be apparent to those skilled in the art that various modifications and variation can be made in the structure of the light emitting device and the method for fabricating the device of the present invention without departing from the spirit or scope of the invention. Thus, it is intended that the present invention cover the modifications and variations of this invention provided they come within the scope of the appended claims and their equivalents.

What is claimed is:

1. A method for fabricating a light emitting device, including covering the light emitting device with a reflective layer, comprising steps of
   providing a mold;
   coating a plastic layer on the mold;
   coating the reflective layer on the plastic layer;
   softening the plastic layer;
   impressing the mold upon the light emitting device so that the outer surfaces of the light emitting device are covered with the reflective layer coated on the mold due to deformation of the plastic layer;
   hardening the plastic layer; and
   removing the mold.

2. The method as claimed in claim 1, wherein the light emitting device is a light emitting diode die, or a laser die.

3. The method as claimed in claim 1, wherein the light emitting device is a plurality of light emitting diode dies, or a plurality of laser dies.

4. The method as claimed in claim 1, wherein the light emitting device is a wafer-level light emitting diode die, or a wafer-level laser die.

5. The method as claimed in claim 1, wherein a packaging structure of the light emitting device is selected from one of the group consisting of wire-bonding packaging structure, flip-hip packaging structure, and wafer-level packaging structure.

6. The method as claimed in claim 1, wherein the mold is a material having thermal conductivity, and the material is selected from one of the group consisting of gold, silver, copper, iron, tin, aluminum, titanium, beryllium, chromium, germanium, gallium, lead, nickel, zinc, silicon, blue sapphire, ceramics, polymer, and a combination thereof.

7. The method as claimed in claim 1, wherein the plastic layer is a material having elastic-plastic property, and the material is selected from one of the group consisting of polydimethylsiloxane (PDMS), poly(methyl methacrylate) (PMMA), polyurethane elastomers, polystyrenes, olefins, dienes, polyethylenes, polyvinyl chlorides, polyesters, organic fluorines, and a combination thereof.

8. The method as claimed in claim 1, wherein coating the plastic layer and coating the reflective layer are performed by one process selected from the group consisting of spin coating, deposition, injection molding, and imprinting.

9. The method as claimed in claim 1, wherein softening the plastic layer is performed by one process selected from the group consisting of heating, and adding plastifier.

10. The method as claimed in claim 1, wherein hardening the plastic layer is performed by one process selected from the group consisting of cooling, and adding hardener.

11. The method as claimed in claim 1, further comprises removing a portion of the reflective layer.

12. The method as claimed in claim 11, wherein removing the portion of the reflective layer is performed by one process selected from the group consisting of photolithography and etching, softlithography and etching, imprinting, laser ion beam processing, and micro machining.

* * * * *